(12) United States Patent
Chou

(10) Patent No.: US 8,692,602 B2
(45) Date of Patent: Apr. 8, 2014

(54) METHOD AND APPARATUS OF DIGITAL CONTROL DELAY LINE

(75) Inventor: Mao-Hsuan Chou, Xinfeng Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/600,021

(22) Filed: Aug. 30, 2012

(65) Prior Publication Data

US 2014/0028366 A1    Jan. 30, 2014

Related U.S. Application Data

(60) Provisional application No. 61/677,295, filed on Jul. 30, 2012.

(51) Int. Cl.
*H03H 11/26* (2006.01)

(52) U.S. Cl.
USPC ........... 327/277; 327/269; 327/270; 327/271; 327/276

(58) Field of Classification Search
USPC .................................. 327/276, 277
See application file for complete search history.

(56) References Cited

U.S. PATENT DOCUMENTS

| 5,463,337 A | * | 10/1995 | Leonowich | 327/158 |
| 5,909,133 A | * | 6/1999 | Park | 327/277 |
| 7,932,765 B2 | | 4/2011 | Kapusta et al. | |
| 8,487,678 B2 | * | 7/2013 | Yang | 327/158 |

* cited by examiner

*Primary Examiner* — John Poos
(74) *Attorney, Agent, or Firm* — Slater & Matsil, L.L.P.

(57) ABSTRACT

A digital controlled delay line (DCDL) includes a signal gated delay line generating a delayed signal, a phase selector, a controller, an input signal and an output signal. The phase selector includes logic gates to couple the delayed signal from the signal gated delay line to the output signal. Preventing signal propagation to unused cells and logic gates reduces power consumption. The number of logic gates in the phase selector the delayed signal passes through is $\log_2 p$, wherein p is the number of the signal gated delay cells in the signal gated delay line and p is a power of 2. The number of logic gates is (integer part of $\log_2 p$)+1, wherein p is the number of the signal gated delay cells and p is not a power of 2.

20 Claims, 6 Drawing Sheets

METHOD AND APPARATUS OF DIGITAL CONTROL DELAY LINE

This application claims the benefit of U.S. Provisional Application Ser. No. 61/677,295, filed on Jul. 30, 2012, entitled "Method and Apparatus of Digital Control Delay Line", which application is hereby incorporated herein by reference.

FIELD OF DISCLOSURE

The present disclosure is related to a digital controlled delay line (DCDL).

BACKGROUND

Delay locked loops (DLLs) are often used in integrated circuits (ICs) to generate an internal clock signal. In a typical DLL, the internal clock signal is generated by a digital controlled delay line (DCDL). The DCDL is used to prevent an external clock signal from arriving at an output until a predetermined time has elapsed. The DCDL typically contains several delay cells, with each of the delay cells having a corresponding delay time. Total delay time in the DCDL is determined by increasing or decreasing the number of delay cells that a signal passes through. To achieve finer granularity in delay time adjustments, the DCDL includes a huge amount of delay cells that consume enormous operation power.

DETAILED DESCRIPTION

The making and using of the embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. A DCDL includes a signal gated delay line, a phase selector, a controller, an input signal and an output signal. The signal gated delay line includes signal gated delay cells to generate a delayed signal of the input signal based on a control of the controller. The phase selector includes logic gates to couple the delayed signal of the input signal from the signal gated delay line to the output signal. In some embodiments, by preventing signal propagation to unused signal gated delay cells in the signal gated delay line and logic gates in the phase selector, overall power consumption of the DCDL is reduced. In some embodiments, the phase selector is created such that the number of logic gates in the phase selector the delayed signal passes through is $\log_2 p$, wherein p is the number of the signal gated delay cells in the signal gated delay line and p is a power of 2. The number of logic gates in the phase selector the delayed signal passes through is (integer part of $\log_2 p$)+1, wherein p is the number of the signal gated delay cells in the signal gated delay line and p is not a power of 2.

Figure 1:
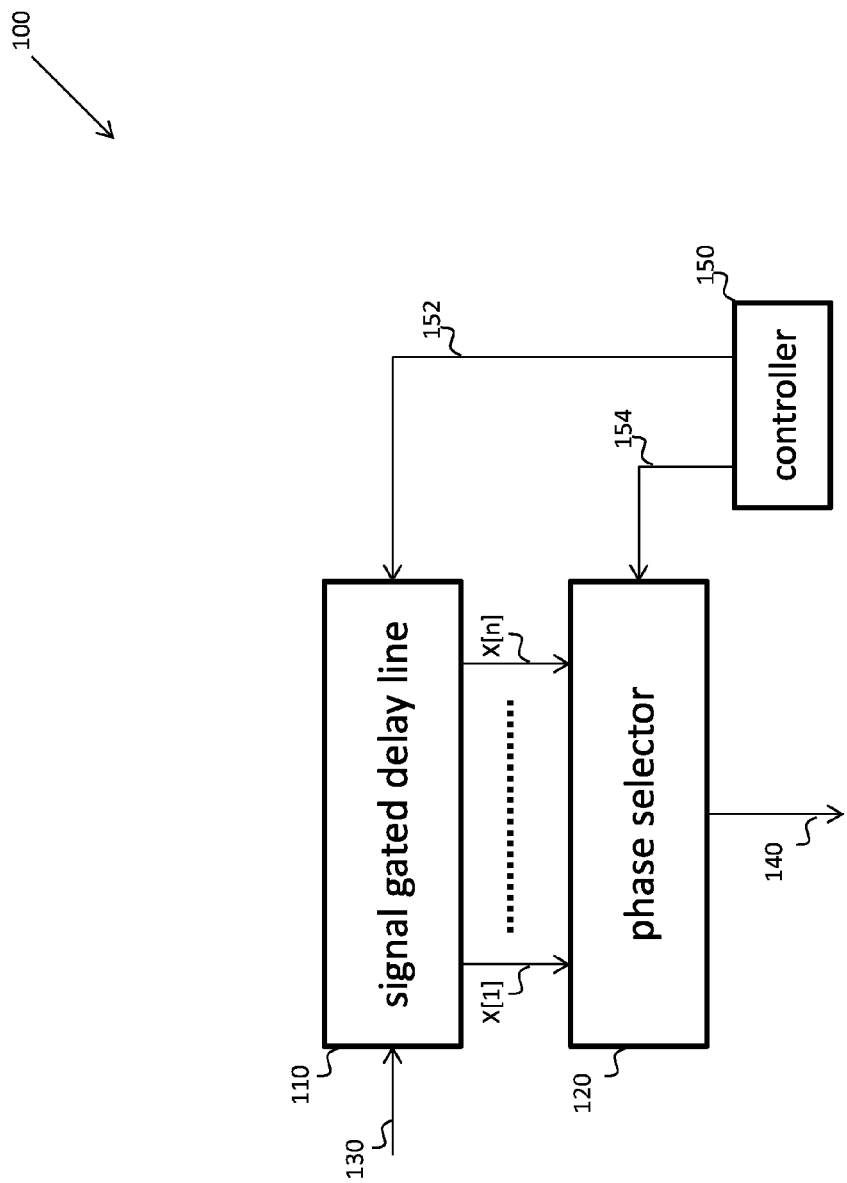
FIG. 1 is a block diagram of a DCDL in accordance with some embodiments.

FIG. 1 is a block diagram of a DCDL 100 according to some example embodiments. The DCDL 100 includes a signal gated delay line 110, a phase selector 120, a controller 150, an input signal 130 and an output signal 140. The signal gated delay line 110 generates a delayed signal of the input signal 130 with a predetermined time delay based on the control of the controller 150 through signals 152. A plurality of output signals X[1] to X[n] are arranged to transmit the generated delayed signal from the signal gated delay line 110 to the phase selector 120. In some embodiments, the value n is substantially equal to the total number of the signal gated delay cells of the signal gated delay line 110. The delayed signal of the input signal 130 is electrically connected to one of the plurality of output signals X[1] to X[n]. The rest of the plurality of the output signals X[1] to X[n] are set to a constant value, for example, a logical "1" or logical "0". The phase selector 120 includes a plurality of 2-to-1 logic gates. The phase selector 120 receives the plurality of output signals X[1] to X[n], and is electrically connected to the output signal 140. In some embodiments, the routing path in the phase selector 120 for the delayed signal of the input signal 130 is controlled by controller 150 through signals 154.

Figure 2A:
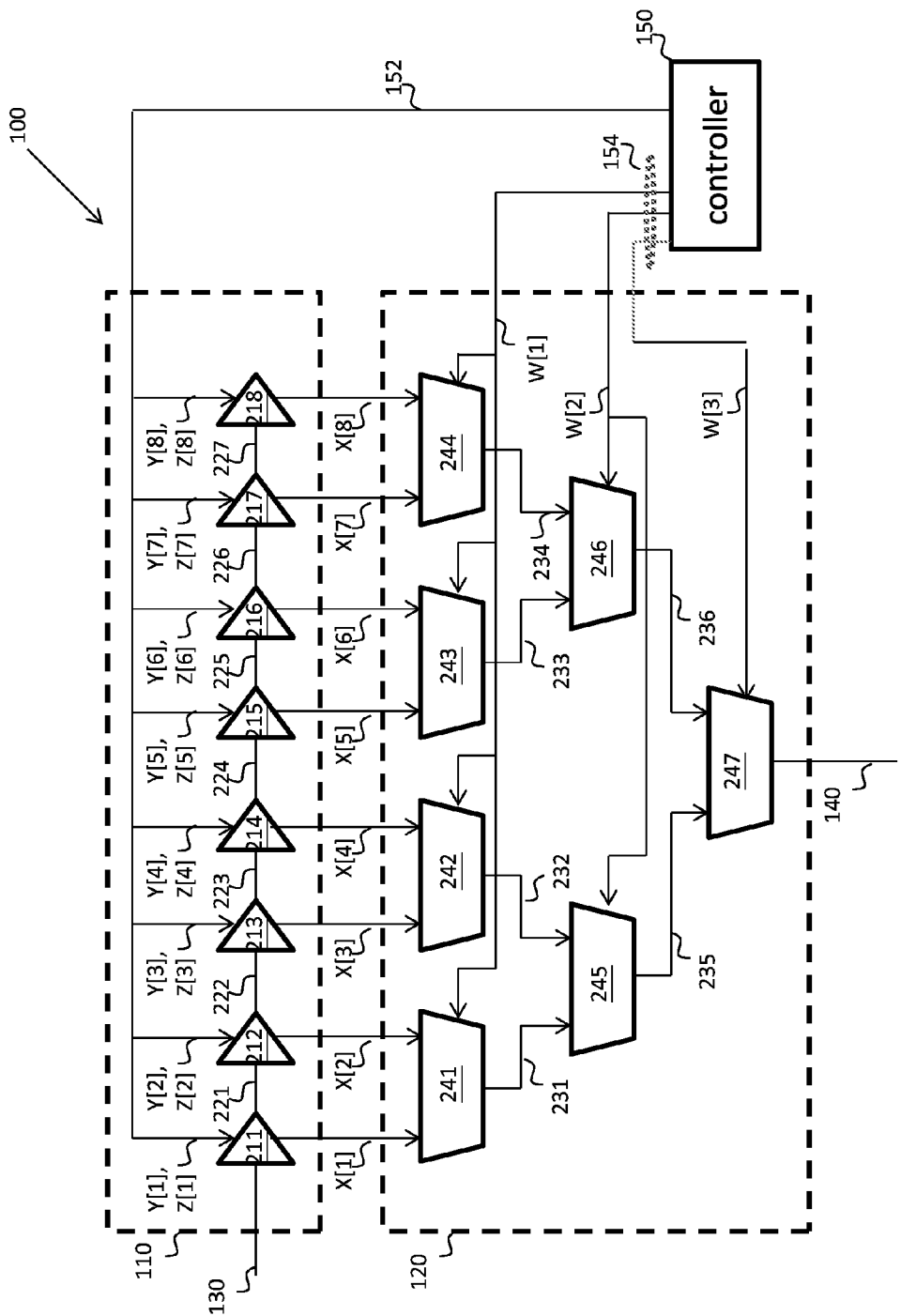
FIG. 2A illustrates details of the signal gated delay line 110 and the phase selector 120 of the DCDL 100 in FIG. 1 in accordance with some embodiments.

FIG. 2A illustrates details of the signal gated delay line 110 and the phase selector 120 of the DCDL 100 in FIG. 1 according to some embodiments. The signal gated delay line 110 includes signal gated delay cells 211, 212, 213, 214, 215, 216, 217 and 218, output signals X[n] with n=1 to 8, and output signals 221, 222, 223, 224, 225, 226 and 227 of corresponding signal gated delay cells 211, 212, 213, 214, 215, 216 and 217. The signal gated delay line 110 further includes control signals Y[n] and control signals Z[n], with n=1 to 8. In some embodiments, the biggest value of n is substantially equal to the total number of the signal gated delay cells in the signal gated delay line 110. Although the signal gated delay line 110 in FIG. 2A only has eight signal gated delay cells, other numbers of signal gated delay cell are within the scope of various embodiments. Each of the signal gated delay cells 211, 212, 213, 214, 215, 216, 217, 218 generates a corresponding one of the output signals X[n] and a corresponding one of output signals 221, 222, 223, 224, 225, 226, 227 according to values of the corresponding control signal Y[n] and Z[n], with n=1 to 8. For example, the output signal X[1] and the output signal 221 are generated by the signal gated delay cell 211 according to values of the control signal Y[1] and Z[1]. The output signals X[n], n=1 to 8, are arranged to transmit the delayed signal of the input signal 130 to the phase selector 120. Each of the output signals 221, 222, 223, 224, 225, 226 and 227 are arranged to connect with an adjacent one of the signal gated delay cells. For example, the output signal 221 of the signal gated delay cell 211 is electrically connected to the signal gated delay cell 212.

Each of the signal gated delay cells 211, 212, 213, 214, 215, 216, 217, 218 receives two separated control signals, the control signals Y[n] and the control signals Z[n] from the controller 150. The control signals Y[n] and the control signals Z[n], n=1 to 8, are arranged to determine values of the output signals of the signal gated delay cells 211, 212, 213, 214, 215, 216, 217, 218. For example, the signal gated delay cell 211 receives the input signal 130, and generates the output signal 221 based on the value of the control signal Y[1]. When the control signal Y[1] is set to "1", a delayed signal of the input signal 130 is generated and connected to the output signal 221. When the control signal Y[1] is set to "0", a constant value "0" is set to the output signal 221. The signal gated delay cell 211 receives the input signal 130, and also generates the output signal X[1] based on the value of the control signal Z[1]. When the control signal Z[1] is set to "1", the output signal X[1] is substantially equal to the input signal 130 delayed by a delay value. When the control signal Z[1] is set to "0", a constant value "0" is set to the output signal X[1].

The signal gated delay cell 212 receives the signal 221, and generates the output signal 222 based on the value of the control signal Y[2]. When the control signal Y[2] is set to "1", a delayed signal of the signal 221 is generated and connected to the output signal 222. When the control signal Y[2] is set to "0", a constant value "0" is set to the output signal 222. The signal gated delay cell 212 receives the signal 221, and also generates the output signal X[2] based on the value of the control signal Z[2]. When the control signal Z[2] is set to "1", the output signal X[2] is substantially equal to the signal 221 delayed by a delay value. When the control signal Z[2] is set to "0", a constant value "0" is set to the output signal X[2].

The signal gated delay cell 213 receives the signal 222, and generates the output signal 223 based on the value of the control signal Y[3]. When the control signal Y[3] is set to "1", a delayed signal of the signal 222 is generated and connected to the output signal 223. When the control signal Y[3] is set to "0", a constant value "0" is set to the output signal 223. The signal gated delay cell 213 receives the signal 222, and also generates the output signal X[3] based on the value of the control signal Z[3]. When the control signal Z[3] is set to "1", the output signal X[3] is substantially equal to the signal 222 delayed by a delay value. When the control signal Z[3] is set to "0", a constant value "0" is set to the output signal X[3].

The signal gated delay cell 214 receives the signal 223, and generates the output signal 224 based on the value of the control signal Y[4]. When the control signal Y[4] is set to "1", a delayed signal of the signal 223 is generated and connected to the output signal 224. When the control signal Y[4] is set to "0", a constant value "0" is set to the output signal 224. The signal gated delay cell 214 receives the signal 223, and also generates the output signal X[4] based on the value of the control signal Z[4]. When the control signal Z[4] is set to "1", the output signal X[4] is substantially equal to the signal 223 delayed by a delay value. When the control signal Z[4] is set to "0", a constant value "0" is set to the output signal X[4].

The signal gated delay cell 215 receives the signal 224, and generates the output signal 225 based on the value of the control signal Y[5]. When the control signal Y[5] is set to "1", a delayed signal of the signal 224 is generated and connected to the output signal 225. When the control signal Y[5] is set to "0", a constant value "0" is set to the output signal 225. The signal gated delay cell 215 receives the signal 224, and also generates the output signal X[5] based on the value of the control signal Z[5]. When the control signal Z[5] is set to "1", the output signal X[5] is substantially equal to the signal 224 delayed by a delay value. When the control signal Z[5] is set to "0", a constant value "0" is set to the output signal X[5].

The signal gated delay cell 216 receives the signal 225, and generates the output signal 226 based on the value of the control signal Y[6]. When the control signal Y[6] is set to "1", a delayed signal of the signal 225 is generated and connected to the output signal 226. When the control signal Y[6] is set to "0", a constant value "0" is set to the output signal 226. The signal gated delay cell 216 receives the signal 225, and also generates the output signal X[6] based on the value of the control signal Z[6]. When the control signal Z[6] is set to "1", the output signal X[6] is substantially equal to the signal 225 delayed by a delay value. When the control signal Z[6] is set to "0", a constant value "0" is set to the output signal X[6].

The signal gated delay cell 217 receives the signal 226, and generates the output signal 227 based on the value of the control signal Y[7]. When the control signal Y[7] is set to "1", a delayed signal of the signal 226 is generated and connected to the output signal 227. When the control signal Y[7] is set to "0", a constant value "0" is set to the output signal 227. The signal gated delay cell 217 receives the signal 226, and also generates the output signal X[7] based on the value of the control signal Z[7]. When the control signal Z[7] is set to "1", the output signal X[7] is substantially equal to the signal 226 delayed by a delay value. When the control signal Z[7] is set to "0", a constant value "0" is set to the output signal X[7].

The signal gated delay cell 218 receives the signal 227, and generates the output signal X[8] based on the value of the control signal Z[8]. When the control signal Z[8] is set to "1", the output signal X[8] is substantially equal to the signal 227 delayed by a delay value. When the control signal Z[8] is set to "0", a constant value "0" is set to the output signal X[8].

In some embodiments, the delay time of each of the signal gated delay cells is different from one another. In some embodiments, the delay time of each of the signal gated delay cells is similar.

The phase selector 120 includes 2-to-1 multiplexers 241, 242, 243, 244, 245, 246 and 247. In some embodiments, the 2-to-1 multiplexers 241, 242, 243, 244, 245, 246, 247 of the phase selector 120 in FIG. 2A are configured to function as an 8-to-1 multiplexer. The 2-to-1 multiplexer in the phase selector 120 is selected for illustration purpose; other types of r-to-1 multiplexers are within the scope of various embodiment. The phase selector 120 receives the output signals X[n], n=1 to 8, from the signal gated delay line 110. One of the output signals X[n], n=1 to 8, is selected and is connected to the output signal 140 based on values of control signals W[m], m=1 to 3. The signals W[m] are generated by the controller 150. The values of n and m are selected for illustration purpose; other values of n and m are within the scope of various embodiments. The 2-to-1 multiplexers of the phase selector 120 are configured as a binary tree. Each of the output signals X[n], n=1 to 8, from the signal gated delay line 110 corresponds to a leaf node of the binary tree, and is electrically connected to an input of a corresponding one of the 2-to-1 multiplexers. A root node of the binary tree is electrically connected to the output signal 140.

For example, the 2-to-1 multiplexer 241 receives the output signal X[1] and the output signal X[2], and outputs a signal 231 based on the value of the control signal W[1]. When control signal W[1] is set to "0", the signal 231 is substantially equal to the output signal X[1] delayed by a delay value. When control signal W[1] is set to "1", the signal 231 is substantially equal to the output signal X[2] delayed by a delay value. The 2-to-1 multiplexer 242 receives the output signal X[3] and the output signal X[4], and outputs a signal 232 based on the value of the control signal W[1]. When control signal W[1] is set to "0", the signal 232 is substantially equal to the output signal X[3] delayed by a delay value. When the control signal W[1] is set to "1", the signal 232 is substantially equal to the output signal X[4] delayed by a delay value. The 2-to-1 multiplexer 243 receives the output signal X[5] and the output signal X[6], and outputs a signal 233 based on the value of the control signal W[1]. When the control signal W[1] is set to "0", the signal 233 is substantially equal to the output signal X[5] delayed by a delay value. When the control signal W[1] is set to "1", the signal 233 is substantially equal to the output signal X[6] delayed by a delay value. The 2-to-1 multiplexer 244 receives the output signal X[7] and the output signal X[8], and outputs a signal 234 based on the value of the control signal W[1]. When the control signal W[1] is set to "0", the signal 234 is substantially equal to the output signal X[7] delayed by a delay value. When the control signal W[1] is set to "1", the signal 234 is substantially equal to the output signal X[8] delayed by a delay value.

The 2-to-1 multiplexer 245 receives the signal 231 and the signal 232, and outputs a signal 235 based on the value of the control signal W[2]. When the control signal W[2] is set to "0", the signal 235 is substantially equal to the signal 231 delayed by a delay value. When the control signal W[2] is set to "1", the signal 235 is substantially equal to the signal 232 delayed by a delay value. The 2-to-1 multiplexer 246 receives the signal 233 and the signal 234, and outputs a signal 236 based on the value of the control signal W[2]. When the control signal W[2] is set to "0", the signal 236 is substantially equal to the signal 233 delayed by a delay value. When the control signal W[2] is set to "1", the signal 236 is substantially equal to the signal 234 delayed by a delay value. The 2-to-1 multiplexer 247 receives the signal 235 and the signal 236, and outputs the output signal 140 based on the value of the control signal W[3]. When the control signal W[3] is set to "0", the output signal 140 is substantially equal to the signal 235 delayed by a delay value. When the control signal W[3] is set to "1", the output signal 140 is substantially equal to the signal 236 delayed by a delay value.

Figure 2B:
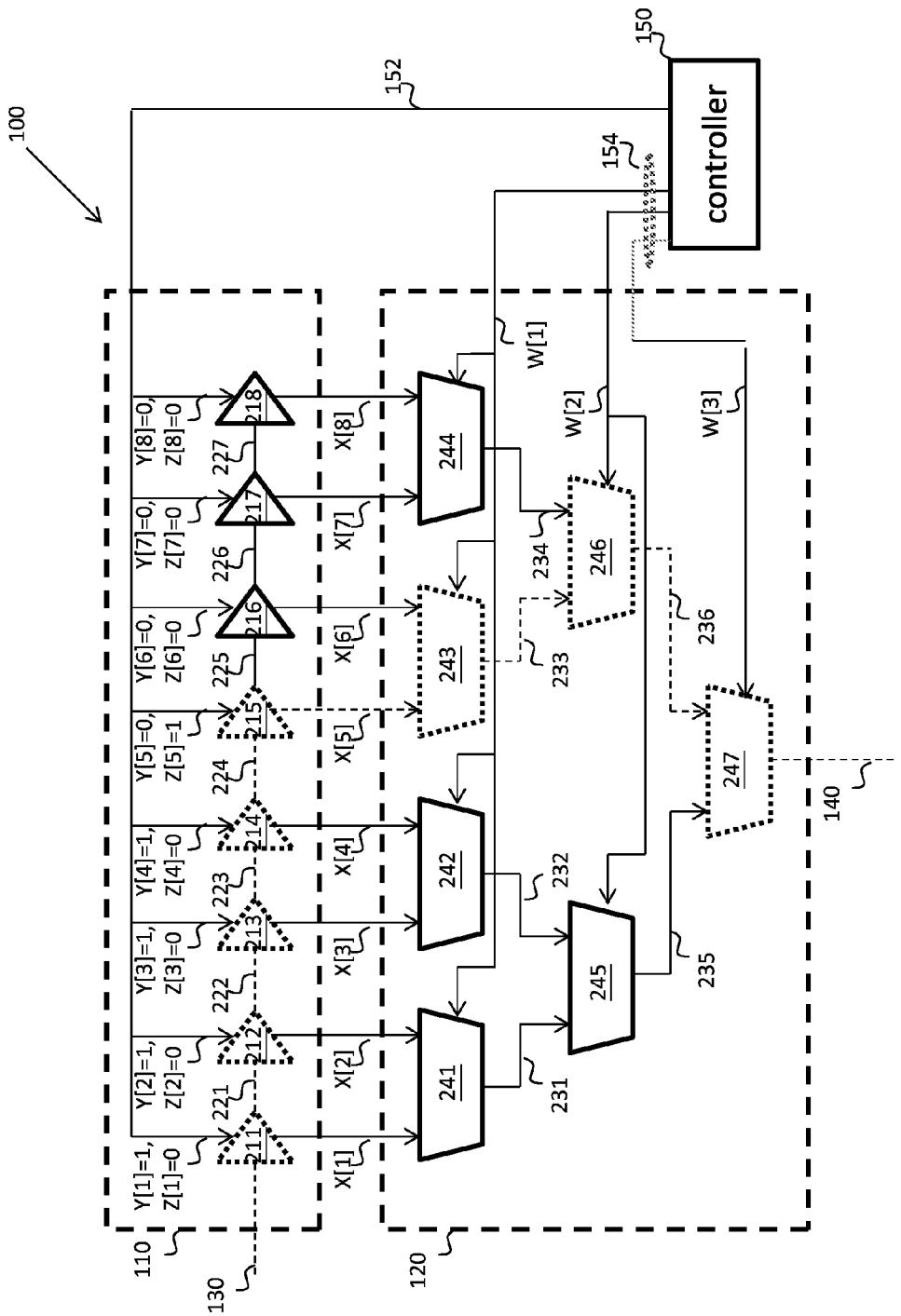
FIG. 2B demonstrates an example to generate a delayed signal with a predetermined delay in a DCDL in accordance with some embodiments.

FIG. 2B demonstrates an example to generate a delayed signal with a predetermined delay in the DCDL 100 according to some further embodiments. In FIG. 2B, a delayed signal with four times of a delay unit of a signal gated delay cell is generated and connected to the output signal 140. The corresponding routing path from the input signal 130 to the output signal 140 is illustrated by the dotted line in FIG. 2B. In some embodiments, the delay unit of a signal gated delay cell is the time delay between a corresponding input signal and a corresponding output signal of the signal gated delay cell. In the example of FIG. 2B, the control signals Y[n], n=1 to 8, are set to "1, 1, 1, 1, 0, 0, 0, 0" by the controller 150. The output signal 221 is substantially equal to the input signal 130 with time delay of the signal gated delay cell 211. The output signal 222 is substantially equal to the input signal 130 with time delay of signal gated delay cells 211 and 212. The output signal 223 is substantially equal to the input signal 130 with time delay of signal gated delay cells 211, 212 and 213. The output signal 224 is substantially equal to the input signal 130 with time delay of signal gated delay cells 211, 212, 213 and 214. The output signals 225, 226 and 227 are each set to a constant value "0" as Y[5], Y[6] and Y[7] are each set to "0".

The control signals Z[n], n=1 to 8, are set to "0, 0, 0, 0, 1, 0, 0, 0" by the controller 150. In the example of FIG. 2B, the output signals X[n], n=1 to 8, are each set to a constant value "0" except the output signal X[5] that is substantially equal to the output signal 224 delayed by a delay value. The control signals W[m], m=1 to 3, are set to "0, 0, 1" by the controller 150 such that the signal X[5] is selected and is connected to the output signal 140, as illustrated by the dotted line through 2-to-1 multiplexers 243, 246 and 247 in FIG. 2B. The signal 231, 232 and 234 are each set to a constant value "0" as inputs of the 2-to-1 multiplexers 241, 242 and 244 are each set to a constant value "0". The signal 235 is set to a constant value "0" as the input signals 231 and 232 of the 2-to-1 multiplexer 245 are each set to a constant value "0".

The dynamic power consumption of a circuit is determined according to following equation.

$$\text{Dynamic power } P = A \cdot C \cdot V^2 \cdot F$$

wherein A represents activity factor, i.e. the fraction of the circuit that is switching. C represents the switched capacitance. V represents the supply voltage. F represents the clock frequency. According to this equation, the dynamic power is directly proportional to the clock frequency. In other words, when the clock frequency of a circuit is zero, the circuit consumes zero dynamic power. In FIG. 2B, the signals 225, 226 and 227 are each set to a constant value "0" such that the signal gated delay cells 216, 217 and 218 consume zero dynamic power as the corresponding clock frequency is zero. Similarly, the multiplexers 241, 242, 244 and 245 consume zero dynamic power as the corresponding inputs are each set to a constant value "0" and the corresponding clock frequency is zero. By preventing signal propagation to unused signal gated delay cells and 2-to-1 multiplexers, overall power consumption of the DCDL 100 is reduced such that a life time of batteries in mobile applications with an embedded DCDL 100 is extended.

In FIG. 2B, each of the output signals X[n], n=1 to 8, passes through three 2-to-1 multiplexers to arrive at the output signal 140 in the phase selector 120. For example, the signal X[5] passes through 2-to-1 multiplexers 243, 246 and 247 to arrive at the output signal 140. In phase selector 120, the number of 2-to-1 multiplexer arranged to pass the output signal X[n], n=1 to p, to arrive at the output signal 140 is determined as followings: the number of 2-to-1 multiplexers=$\log_2 p$, where p is a power of 2; and the number of 2-to-1 multiplexers= (integer part of $\log_2 p$)+1, where p is not a power of 2.

In some embodiments, the phase selector 120 includes r-to-1 multiplexers (not shown), the number of r-to-1 multiplexer in phase selector 120 arranges to pass through for the output signal X[n], n=1 to p, to arrive at the output signal 140 is determined according to the following equation.

the number of r-to-1 multiplexer arranges to pass through=$\log_r p$, where p is a power of r; and the number of r-to-1 multiplexer arranges to pass through=(integer part of $\log_r p$)+1, where p is not a power of r.

Figure 3:
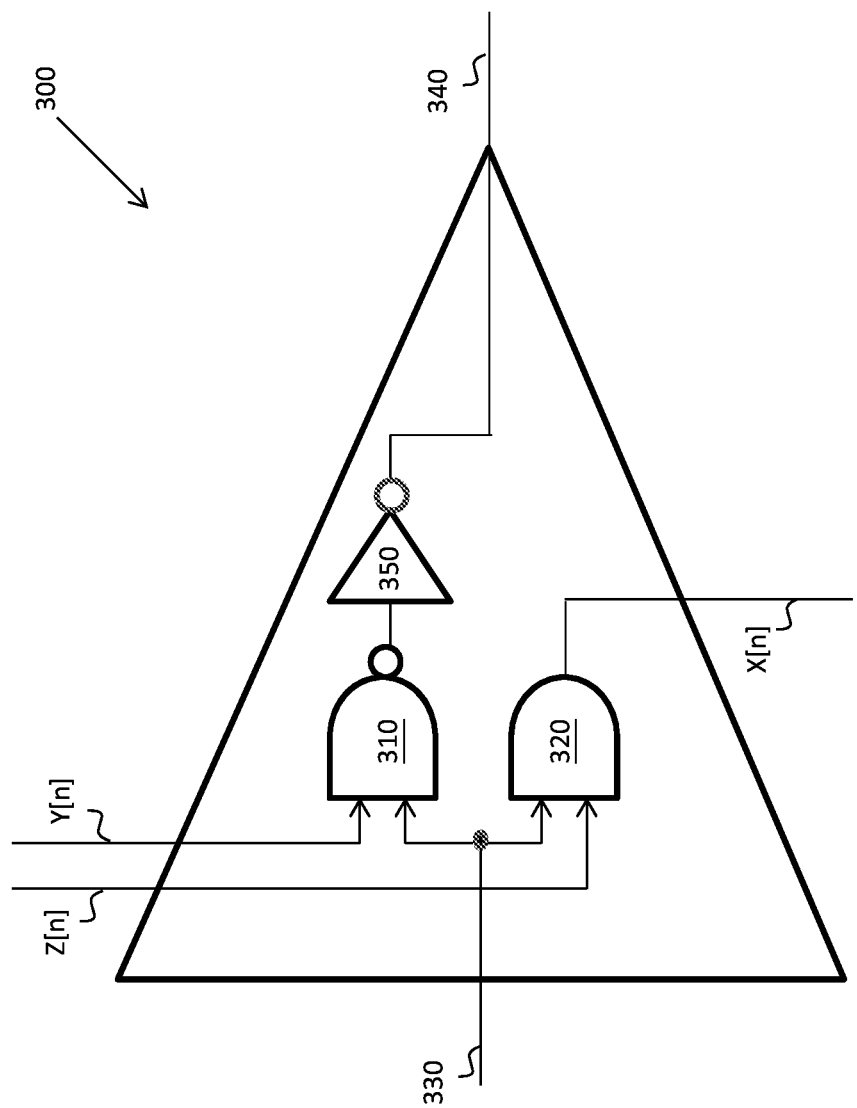
FIG. 3 is a schematic diagram of a signal gated delay cell used in FIG. 2A, FIG. 2B and FIG. 4 in accordance with some embodiments.
Figure 4:
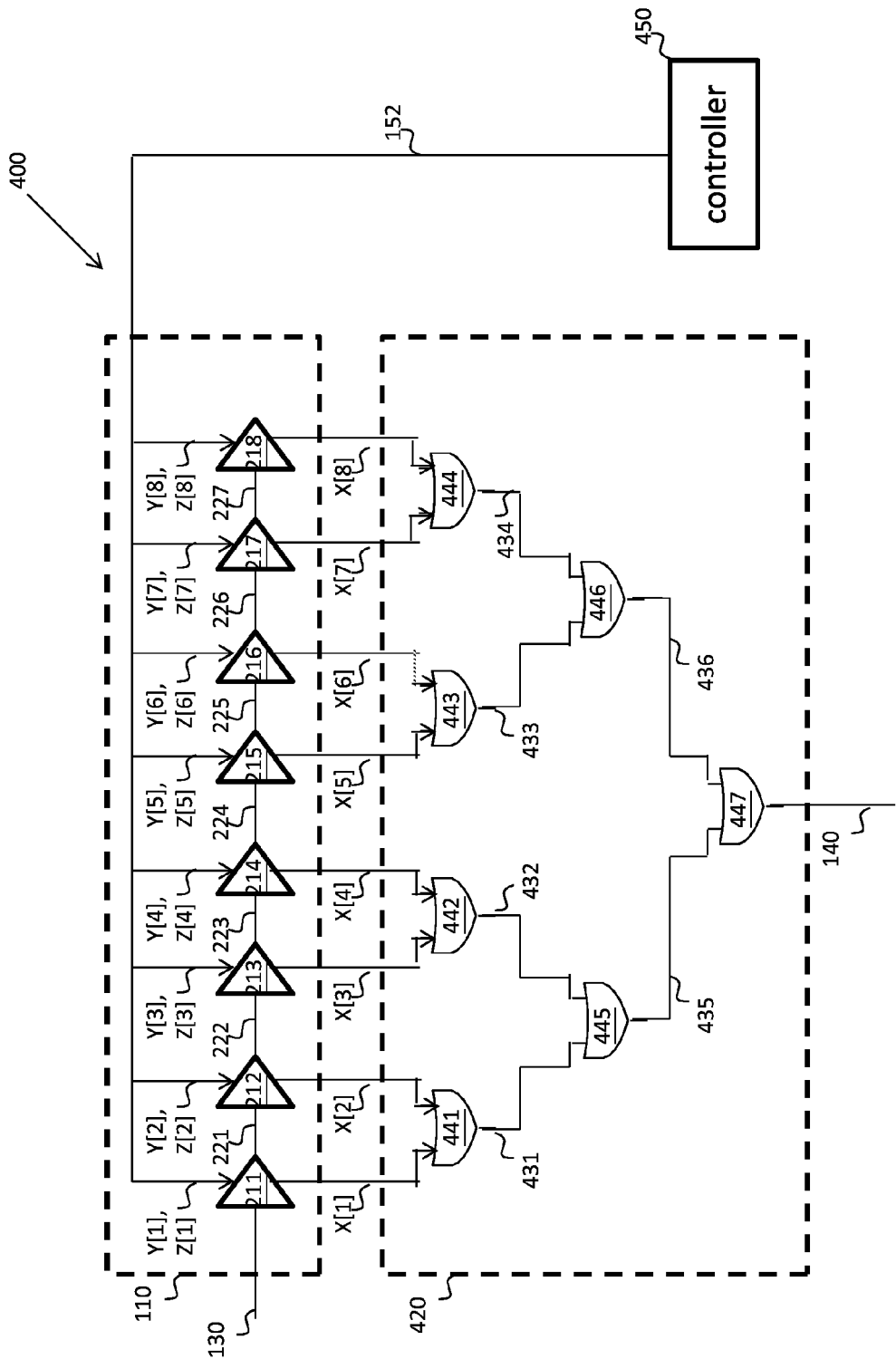
FIG. 4 is a schematic diagram of another DCDL in accordance with some embodiments.

FIG. 3 is a schematic diagram of a signal gated delay cell 300 used in FIG. 2A, FIG. 2B and FIG. 4 according to some example embodiments. The signal gated delay cell 300 includes NAND gate 310, AND gate 320, NOT gate 350, an input signal 330, an output signal 340, a control signal Y[n] and a control signal Z[n] set by the controller 150 in FIG. 2, and an output signal X[n]. Although the signal gated delay cell 300 only uses NAND gate, AND gate and NOT gate, other different logic circuits including combinations of gates, such as NAND, NOR, AND, OR, XOR, XNOR, and/or NOT gates are within the scope of various embodiments. When the control signal Y[n] is set to "1", the output signal 340 is substantially equal to the input signal 330 with time delay of the NAND gate 310 and the NOT gate 350. When the control signal Y[n] is set to "0", the output signal 340 is set to a constant value "0". When the control signal Z[n] is set to "1", the output signal X[n] is substantially equal to the input signal 330 with time delay of the AND gate 320. When the control signal Z[n] is set to "0", the output signal X[n] is set to a constant value "0". In some embodiments, the sizes of transistors in the NAND gate 310 and AND gate 320 are configured such that the time delay of the NAND gate 310 and AND gate 320 are smaller than the time delay in the NOT gate 350. In some embodiments, the sizes of transistors in the NAND gate 310 and the NOT gate 350 are configured such that the predetermined delay value of the input signal 330 is generated and transmitted to the output signal 340.

FIG. 4 is a block diagram of another DCDL 400 according to some example embodiments. The DCDL 400 includes a signal gated delay line 110, a phase selector 420, a controller 450, an input signal 130 and an output signal 140. The signal gated delay line 110, the input signal 130 and the output signal 140 in FIG. 4 are similar to the corresponding ones in FIG. 2A. The output signals X[n], n=1 to 8, are outputted from the corresponding signal gated delay cells in the signal gated delay line 110, and connected to the phase selector 420. The signal gated delay line 110 generates a delayed signal of the input signal 130 with a predetermined time delay based on the control of the controller 450 through control signals 152. Although the signal gated delay line 110 in FIG. 4 has eight signal gated delay cells and output signals X[n], other numbers of signal gated delay cell and output signal X[n] are within the scope of various embodiments.

The phase selector 420 includes 2-to-1 OR gates 441, 442, 443, 444, 445, 446 and 447. Although the phase selector 420 only includes OR gates, other logic circuits including combinations of gates, such as NAND, NOR, AND, OR, XOR, XNOR, NOT gates are within the scope of various embodiments. In some embodiments, the 2-to-1 OR gates of the phase selector 120 in FIG. 4 is configured to function as an 8-to-1 OR gate. The 2-to-1 OR gate in the phase selector 120 is selected for illustration purpose; other types of r-to-1 OR gate are within the scope of various embodiment. The 2-to-1 OR gates of the phase selector 120 are configured as a binary tree. Each of the output signals X[n], n=1 to 8, from the signal gated delay line 110 corresponds to a leaf node of the binary tree, and is electrically connected to an input of a corresponding one of the 2-to-1 OR gates. A root node of the binary tree is electrically connected to the output signal 140.

The 2-to-1 OR gate 441 receives two inputs, the output signal X[1] and the output signal X[2], and outputs a signal 431. The 2-to-1 OR gate 442 receives two inputs, the output signal X[3] and the output signal X[4], and outputs a signal 432. The 2-to-1 OR gate 443 receives two inputs, the output signal X[5] and the output signal X[6], and outputs a signal 433. The 2-to-1 OR gate 444 receives two inputs, the output signal X[7] and the output signal X[8], and outputs a signal 434. The 2-to-1 OR gate 445 receives two inputs, the signal 431 and the signal 432, and outputs a signal 435. The 2-to-1 OR gate 446 receives two inputs, the signal 433 and the signal 434, and outputs a signal 436. The 2-to-1 OR gate 447 receives two inputs, the signal 435 and the signal 436, and outputs the signal 140.

In FIG. 4, each of the output signal X[n], n=1 to 8, passes through three 2-to-1 OR gates to arrive at the output signal 140 in the phase selector 420. For example, the signal X[5] passes through OR gates 443, 446 and 447 to arrive at the output signal 140. In phase selector 420, the number of 2-to-1 OR gates arranged to pass the signal X[n], n=1 to p, to arrive at the output signal 140 is determined as follows in the number of 2-to-1 OR gates=$\log_2 p$, where p is a power of 2; and the number of 2-to-1 OR gates=(integer part of $\log_2 p$)+1, where p is not a power of 2.

In some embodiments, the phase selector 420 includes r-to-1 OR gates (not shown), the number of r-to-1 OR gate in phase selector 420 arranges to pass through for the output signal X[n], n=1 to p, to arrive at the output signal 140 is determined as follows: the number of r-to-1 OR gates=$\log_r p$, where p is a power of r; and the number of r-to-1 OR gates= (integer part of $\log_r p$)+1, where p is not a power of r.

Figure 5:
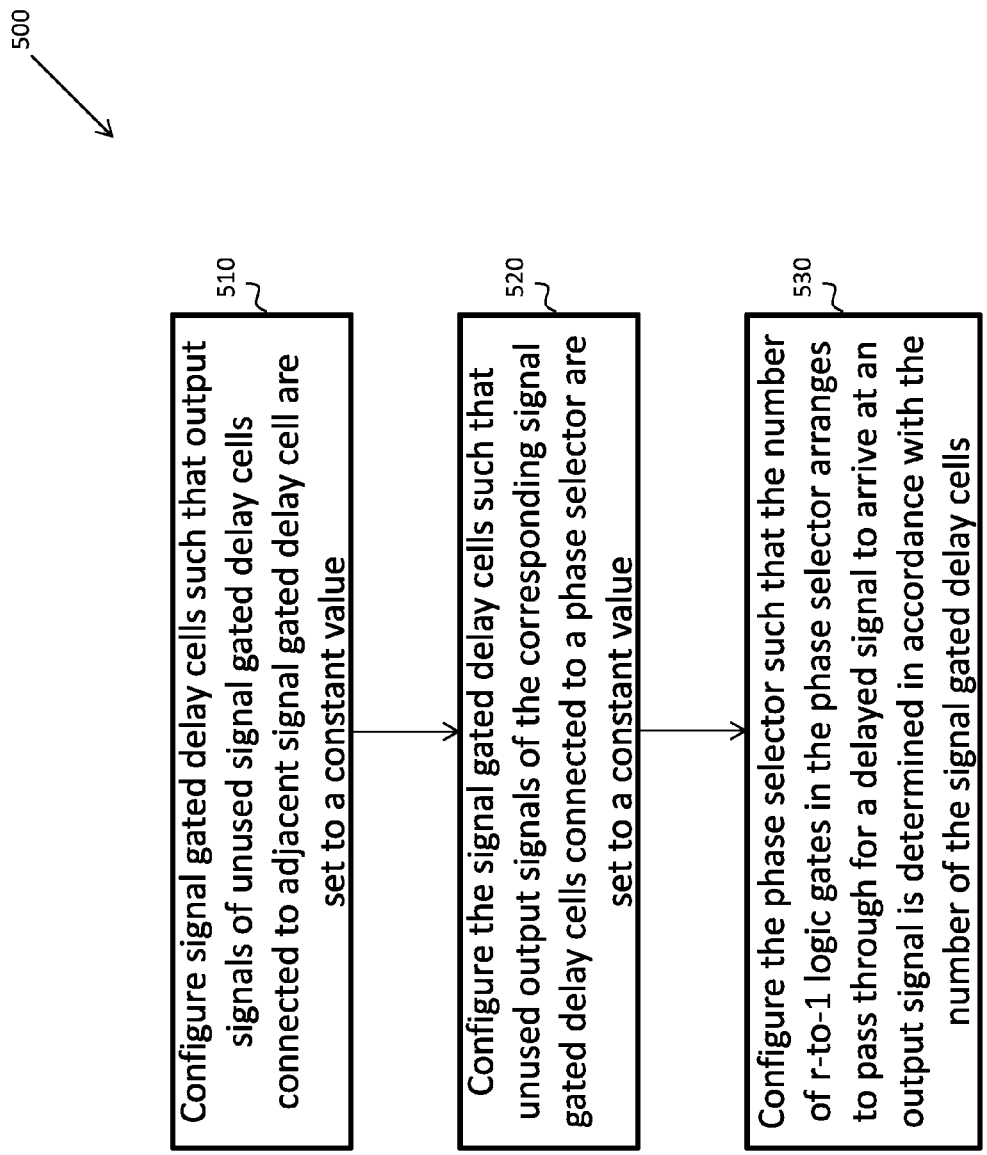
FIG. 5 illustrates a flow chart of a method of generating a DCDL FIG. 1, FIG. 2A, FIG. 2B and FIG. 4 in accordance with some embodiments.

FIG. 5 illustrates a flow chart 500 of a method of generating the DCDL 100 in FIG. 1, FIG. 2A and FIG. 2B according to some example embodiments. The DCDL 100 is used as an example for illustration purposes. The method is applicable to other disclosed DCDLs and circuits, such as DCDL 400 in FIG. 4.

In step 510, the signal gated delay cells in the signal gated delay line 110 are configured by the controller 150 such that the output signals of the unused signal gated delay cells connected to adjacent signal gated delay cell are set to a constant value to save dynamic power. In FIG. 2B, for example, the signal gated delay line 110 generates a delayed signal X[5] with four times of a delay unit of a signal gated delay cell. The routing path from the input signal 130 to the delayed signal X[5] is illustrated by the dotted line through signal gated delay cells 211, 212, 213, 214, 215 according to the control of the control signal 150. The unused signal gated delay cells 216 and 217 are configured according to the control of the control signal 150 to set the corresponding output signals 226 and 227 as a constant value, such that the signal gated delay cells 217 and 218 consume zero dynamic power as the corresponding clock frequency is zero.

In step 520, the signal gated delay cells in the signal gated delay line 110 are configured by the controller 150 such that the unused output signals of the corresponding signal gated delay cells connected to a phase selector 120 are set to a constant value to save dynamic power. In FIG. 2B, for example, the signal gated delay line 110 generates a delayed signal X[5] with four times of a delay unit of a signal gated delay cell. The routing path from the input signal 130 to the delayed signal X[5] is illustrated by the dotted line through signal gated delay cells 211, 212, 213, 214, 215 according to the control of the control signal 150. The unused output signals X[1], X[2], X[3], X[4], X[6], X[7], X[8] of the corresponding signal gated delay cells 211, 212, 213, 214, 216, 217 and 218 are configured according to the control of the control signal 150 to set as a constant value, such that the 2-to-1 multiplexers 241, 242 and 244 consume zero dynamic power as the corresponding clock frequency is zero.

In step 530, the phase selector 120 is configured such that the number of r-to-1 logic gates in the phase selector 120 arranges to pass through for one of the output signals X[n], n=1 to p, to arrive at the output signal 140 is determined in accordance with the number of signal gated delay cells. In FIG. 2A, for example, the number of 2-to-1 multiplexers in the phase selector 120 to pass through for X[5] to arrive at the output signal 140 is substantially equal to ($\log_2 8$), wherein "8" is the number of the signal gated delay cells in the signal gated delay line 110. In some embodiments, the number of 2-to-1 logic gates each of the output signals X[n], n=1 to p, arranged to pass the signal through is $\log_2 p$, where p is a power of 2, or (integer part of $\log_2 p$)+1, where p is not a power of 2.

In some embodiments, a digital controlled delay line (DCDL) circuit includes a signal gated delay line and a phase selector. The signal gated delay line includes a first input signal, a plurality of signal gated delay cells, a first plurality of output signals and a second plurality of output signals. The phase selector includes a plurality of logic gates and a first output signal. The signal gated delay line generates a delayed signal of the input signal, and is electrically connects the delayed signal to one of the first plurality of output signals, and the rest of the first plurality of output signals are set to a constant value. Each of the first plurality of output signals are electrically connected to corresponding one of the plurality of logic gates in the phase selector. The number of logic gates in the phase selector arranges to pass through for the delayed signal to arrive at the first output signal is determined in accordance with the number of the plurality of signal gated delay cells.

In some embodiments, a digital controlled delay line (DCDL) circuit includes a signal gated delay line and a phase selector. The signal gated delay line includes a first input signal, a plurality of signal gated delay cells, a first plurality of output signals and a second plurality of output signals. The signal gated delay line generates a delayed signal of the input signal, and is electrically connects the delayed signal to one of the first plurality of output signals, and the rest of the first plurality of output signals are set to a constant value. The phase selector includes a plurality of logic gates and a first output signal. Each of the plurality of logic gates in the phase selector includes two inputs and one output. The plurality of logic gates in the phase selector are configured as a binary tree such that each of the first plurality of output signals corresponds to a leaf node of the binary tree, and is electrically connected to an input of a corresponding one of the plurality of logic gates, and a root node of the binary tree is electrically connected to the first output signal. The number of logic gates in the phase selector the delayed signal passes through to the first output signal is determined in accordance with the number of the first plurality of output signals.

In some embodiments, a method of configuring a digital controlled delay line (DCDL) includes configuring a plurality of signal gated delay cells in a signal gated delay line such that the output signals of the unused signal gated delay cells, which are connected to adjacent ones of the plurality of signal gated delay cells, are set to a constant value. The method also includes configuring a plurality of signal gated delay cells in a signal gated delay line such that the output signals of the unused signal gated delay cells, which are connected to a phase selector, are set to a constant value. The method further includes configuring a plurality of logic gates in a phase selector such that the number of the plurality of logic gates in the phase selector a delayed signal of the input signal passes through is determined in accordance with the number of signal gated delay cells.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. A digital controlled delay line (DCDL) circuit, comprising:
    a signal gated delay line comprising a first input signal, a plurality of signal gated delay cells, a first plurality of output signals and a second plurality of output signals; and
    a phase selector comprising a plurality of logic gates and a first output signal;
    wherein
        the signal gated delay line generates a delayed signal of the first input signal, and electrically connects the delayed signal to one of the first plurality of output signals, and the rest of the first plurality of output signals are set to a constant value;
        each of the first plurality of output signals is electrically connected to corresponding one of the plurality of logic gates in the phase selector; and
        the number of logic gates in the phase selector arranged to pass through the delayed signal to arrive at the first output signal is determined in accordance with the number of the plurality of signal gated delay cells.

2. The digital controlled delay line (DCDL) circuit of claim 1, wherein each of the plurality of signal gated delay cells comprises gates selected from the group consisting of AND, OR, NAND, NOR, NOT, XOR and XNOR gates, and combinations thereof to generate a respective one of the first plurality of output signals and a respective one of the second plurality of output signals.

3. The digital controlled delay line (DCDL) circuit of claim 2, wherein
    each of the plurality of signal gated delay cells comprises a second input signal and a second output signal, the second output signal of one of the plurality of signal gated delay cells is electrically connected to the second input signal of an adjacent one of the plurality of signal gated delay cells, and the second output signal of each of the plurality of signal gated delay cells is coupled to corresponding one of the second plurality of output signals; and
    the plurality of signal gated delay cells comprise a plurality of unused signal gated delay cells, the second plurality of output signals outputted from the plurality of unused signal gated delay cells are set to a constant value.

4. The digital controlled delay line (DCDL) circuit of claim 1, wherein the function of each of the plurality of logic gates is substantially equal to AND, OR, NAND, NOR, XOR, XNOR gates or multiplexer.

5. The digital controlled delay line (DCDL) circuit of claim 4, wherein each of the plurality of logic gates includes at least two inputs and one output.

6. The digital controlled delay line (DCDL) circuit of claim 5, wherein the plurality of logic gates are configured as a binary tree such that each of the first plurality of output signals corresponds to a leaf node of the binary tree, and is electrically connected to an input of a corresponding one of the plurality of logic gates, and a root node of the binary tree is electrically connected to the first output signal.

7. The digital controlled delay line (DCDL) circuit of claim 1, wherein the number of logic gates the delayed signal passes through is substantially equal to $\log_r P$, wherein P is the number of the plurality of signal gated delay cells and P is a power of r, and each of the plurality of logic gates is an r-to-1 gate.

8. The digital controlled delay line (DCDL) circuit of claim 1, wherein the number of logic gates the delayed signal passes through is substantially equal to (integer part of $\log_r P$)+1, wherein P is the number of the plurality of signal gated delay cells and P is not a power of r, and each of the plurality of logic gates is a r-to-1 gate.

9. A digital controlled delay line (DCDL) circuit, comprising:
    a signal gated delay line comprising a first input signal, a plurality of signal gated delay cells, a first plurality of output signals and a second plurality of output signals, wherein the signal gated delay line generates a delayed signal of the first input signal, and electrically connects the delayed signal to one of the first plurality of output signals, and the rest of the first plurality of output signals are set to a constant value;
    a phase selector comprising a plurality of logic gates and a first output signal,
    wherein
        each of the plurality of logic gates includes at least two inputs and one output;
        the plurality of logic gates are configured as a binary tree such that each of the first plurality of output signals corresponds to a leaf node of the binary tree, and is electrically connected to an input of a corresponding one of the plurality of logic gates, and a root node of the binary tree is electrically connected to the first output signal; and the number of logic gates the delayed signal passes through to the first output signal is determined in accordance with the number of the plurality of signal gated delay cells.

10. The digital controlled delay line (DCDL) circuit of claim 9, wherein each of the plurality of signal gated delay cells comprises combinations of AND, OR, NAND, NOR, NOT, XOR and XNOR gates to generate a corresponding one of the first plurality of output signals and a corresponding one of the second plurality of output signals.

11. The digital controlled delay line (DCDL) circuit of claim 9, wherein each of the plurality of signal gated delay cells comprises a second input signal and a second output signal, the second output signal of one of the plurality of signal gated delay cells is electrically connected to the second input signal of an adjacent one of signal gated delay cells, and the second output signal of each of the plurality of signal gated delay cells is coupled to corresponding one of the second plurality of output signals; and the plurality of signal gated delay cells comprise a plurality of unused signal gated delay cells, the second plurality of output signals outputted from the plurality of unused signal gated delay cells are set to a constant value.

12. The digital controlled delay line (DCDL) circuit of claim 9, wherein the function of each of the plurality of logic gates is substantially equal to AND, OR, NAND, NOR, XOR, XNOR gates or multiplexer.

13. The digital controlled delay line (DCDL) circuit of claim 9, wherein the number of logic gates the delayed signal passes through is substantially equal to $\log_r P$, where P is the number of the first plurality of output signals and P is power of r, and each of the plurality of logic gates is an r-to-1 gate.

14. The digital controlled delay line (DCDL) circuit of claim 9, wherein the number of logic gates the delayed signal passes through is substantially equal to (integer part of $\log_r$ P)+1, where P is the number of the first plurality of output signals and P is not power of r, and each of the plurality of logic gates is an r-to-1 gate.

15. A method of configuring a digital controlled delay line (DCDL), comprising:

configuring a plurality of signal gated delay cells in a signal gated delay line such that output signals of unused signal gated delay cells connected to adjacent ones of the plurality of signal gated delay cells are set to a constant value;

configuring the plurality of signal gated delay cells in the signal gated delay line such that unused output signals of the corresponding signal gated delay cells connected to a phase selector are set to a constant value; and configuring a plurality of logic gates in the phase selector such that the number of logic gates in the phase selector arranged to pass through a delayed signal of an input signal to arrive at an output signal is determined in accordance with the number of signal gated delay cells.

16. The method of claim 15, wherein each of the plurality of logic gates includes at least two inputs and one output.

17. The method of claim 16, wherein the plurality of logic gates is configured as a binary tree such that each of the first plurality of output signals corresponds to a leaf node of the binary tree, and is electrically connected to an input of a corresponding one of the plurality of logic gates, and a root node of the binary tree is electrically connected to the first output signal.

18. The method of claim 15, wherein the number of logic gates the delayed signal passes through is substantially equal to $\log_r$ P, wherein P is the number of the plurality of signal gated delay cells and P is power of r, and each of the plurality of logic gates is an r-to-1 gate.

19. The method of claim 15, wherein the number of logic gates the delayed signal passes through is substantially equal to (integer part of $\log_r$ P)+1, wherein P is the number of the plurality of signal gated delay cells and P is not power of r, and each of the plurality of logic gates is a r-to-1 gate.

20. The method of claim 15, wherein each of the plurality of logic gates performs a function selected from the group consisting of AND, OR, NAND, NOR, XOR, XNOR, and multiplexing.

* * * * *